(12) United States Patent
Kanda

(10) Patent No.: US 8,912,588 B2
(45) Date of Patent: Dec. 16, 2014

(54) SEMICONDUCTOR MEMORY DEVICE

(71) Applicant: Kabushiki Kaisha Toshiba, Tokyo (JP)

(72) Inventor: Kazushige Kanda, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/016,183

(22) Filed: Sep. 2, 2013

(65) Prior Publication Data
US 2014/0291748 A1 Oct. 2, 2014

(30) Foreign Application Priority Data

Mar. 26, 2013 (JP) .................... 2013-065102

(51) Int. Cl.
*H01L 29/788* (2006.01)
*H01L 27/115* (2006.01)

(52) U.S. Cl.
CPC ............... *H01L 27/11517* (2013.01)
USPC ........... 257/316; 257/260; 257/225; 257/390; 257/E27.084

(58) Field of Classification Search
CPC ............ H01L 2924/1438; H01L 21/8229; H01L 21/8239; H01L 27/11529
USPC .............. 257/316, 225, 390, 260, E27.084
See application file for complete search history.

(56) References Cited

U.S. PATENT DOCUMENTS

| | | | |
|---|---|---|---|
| 7,869,280 B2 | 1/2011 | Kosaki et al. | |
| 7,983,078 B2 | 7/2011 | Higashitani | |
| 2008/0137422 A1 | 6/2008 | Hosono | |
| 2012/0069669 A1 | 3/2012 | Sakamoto et al. | |
| 2012/0236644 A1 | 9/2012 | Futatsuyama | |

FOREIGN PATENT DOCUMENTS

JP 2008-098461 A 4/2008

*Primary Examiner* — Elias M Ullah
(74) *Attorney, Agent, or Firm* — Patterson & Sheridan, LLP

(57) ABSTRACT

A semiconductor memory device includes a bit line, an active region formed in a semiconductor substrate, a plug formed on the active region and connecting the bit line to the active region, a memory cell which includes a first gate insulating film on the active region, a charge storage layer on the first gate insulating film, a first insulating film on the charge storage layer, and a control gate electrode on the first insulating film, a select transistor formed between the plug and the memory cell on the active region and including a second gate insulating film on the active region, a first electrode layer on the second gate insulating film, a second insulating film on the first electrode layer, and a second electrode layer on the second insulating film, and a wiring formed above the active region between the plug and the second electrode layer of the select transistor.

20 Claims, 10 Drawing Sheets

SEMICONDUCTOR MEMORY DEVICE

CROSS-REFERENCE TO RELATED APPLICATION

This application is based upon and claims the benefit of priority from Japanese Patent Application No. 2013-065102, filed Mar. 26, 2013, the entire contents of which are incorporated herein by reference.

FIELD

Embodiments described herein relate to a semiconductor memory device.

BACKGROUND ART

Recently, flash memory has become widely used in various electronic equipments as a main storage device, in addition to HDD and CD/DVD. Such flash memory requires, speed up of data input and output, improvement in operational reliability, and reduction of manufacturing cost.

DETAILED DESCRIPTION

Figure 1:
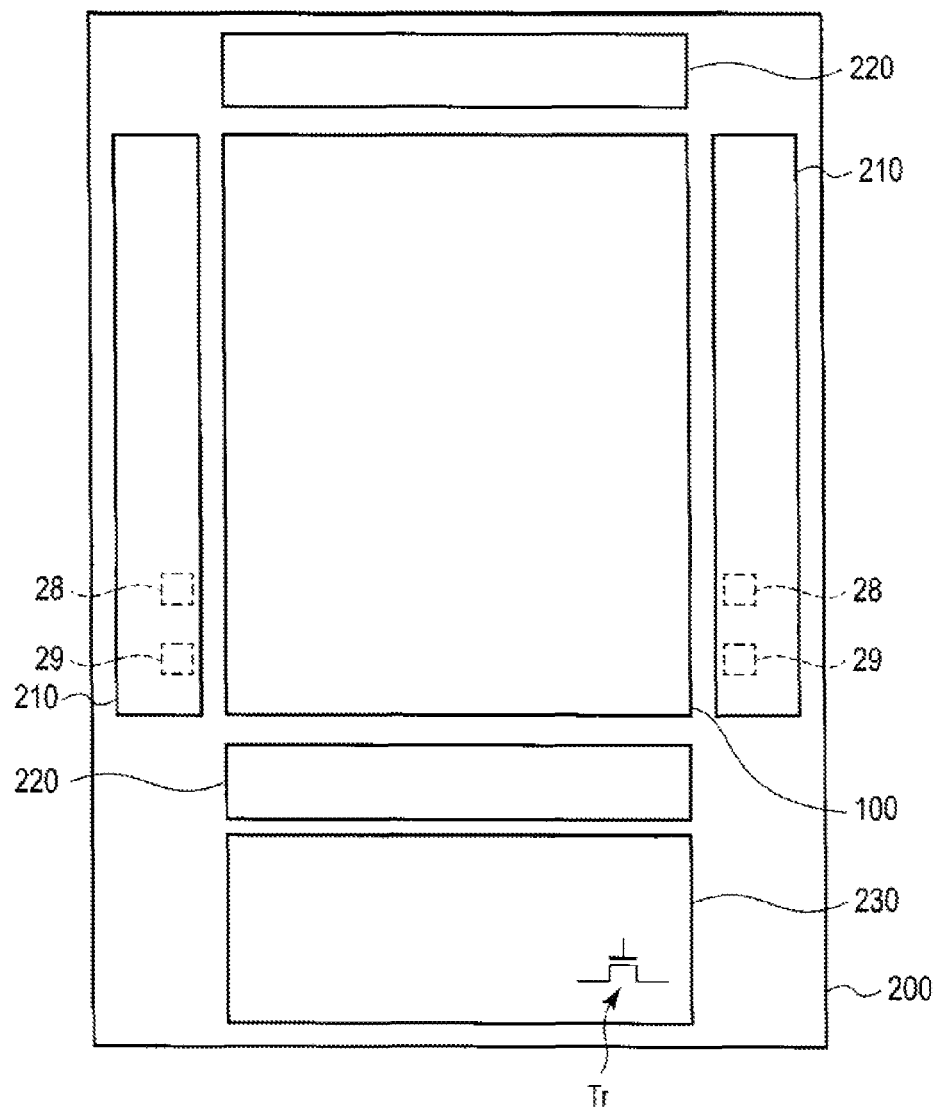
FIG. 1 illustrates one example of a layout of a semiconductor memory according to an embodiment.

In general, according to one embodiment, a technique for relieving an electric field between components of a flash memory is provided.

According to an embodiment, a semiconductor memory device includes a bit line, an active region formed in a semiconductor substrate, a plug formed on the active region and connecting the bit line to the active region, a memory cell which includes a first gate insulating film on the active region, a charge storage layer on the first gate insulating film, a first insulating film on the charge storage layer, and a control gate electrode on the first insulating film, a select transistor formed between the plug and the memory cell on the active region and including a second gate insulating film on the active region, a first electrode layer on the second gate insulating film, a second insulating film on the first electrode layer, and a second electrode layer on the second insulating film, and a wiring formed above the active region between the plug and the second electrode layer of the select transistor.

Hereinafter, a semiconductor memory according to embodiments will be specifically described with reference to FIGS. 1 to 13. In the following description, the same reference numerals are attached to the components having the same functions and the same structures and their overlapped description will be made only in case of necessity.

(1) First Embodiment

A semiconductor memory according to a first embodiment will be described with reference to FIGS. 1 to 8.

(a) Structure

A structure of a semiconductor memory according to the first embodiment will be described using FIGS. 1 to 5. In the embodiment, a NAND-type flash memory is taken by way of example as the semiconductor memory.

FIG. 1 is a schematic view showing a structure of a flash memory. As shown in FIG. 1, the flash memory includes a memory cell array 100 and peripheral circuits for controlling an operation of the memory cell array 100. The memory cell array 100 and the peripheral circuits are formed on the same chip (semiconductor substrate) 70.

The memory cell array 100 includes at least one memory cell and at least one select transistor. The memory cell works as a memory element and the select transistor works as a switch element for selecting a memory cell targeted for writing and reading data.

The peripheral circuits are formed in a peripheral circuit region, which is provided around the memory cell array 100. As the peripheral circuits, row control circuits 210, column control circuits 220, and an internal circuit group 230 are formed in the semiconductor substrate (chip) 70 in which the memory cell array 100 is formed.

The row control circuit 210 includes circuits for controlling the row of the memory cell array 100, such as a word line driver, a select gate line driver, and a row decoder. The column control circuit 220 includes circuits for controlling the column of the memory cell array 100, such as a sense amplifier, a data latch circuit, and a column decoder. The internal circuit 230 includes a charge pump circuit for generating a driving potential of the memory cell array 100, a buffer for temporarily holding input and output data and address, and a state machine for controlling and managing the whole chip.

These circuits 210, 220, and 230 include a plurality of low voltage MOS-transistors and a plurality of high voltage MOS-transistors, as the peripheral transistor Tr configured to satisfy a predetermined dielectric breakdown voltage.

The memory cell array 100 shown in FIG. 1 includes a plurality of blocks. This block BLK indicates a minimum erasable unit.

Figure 2:
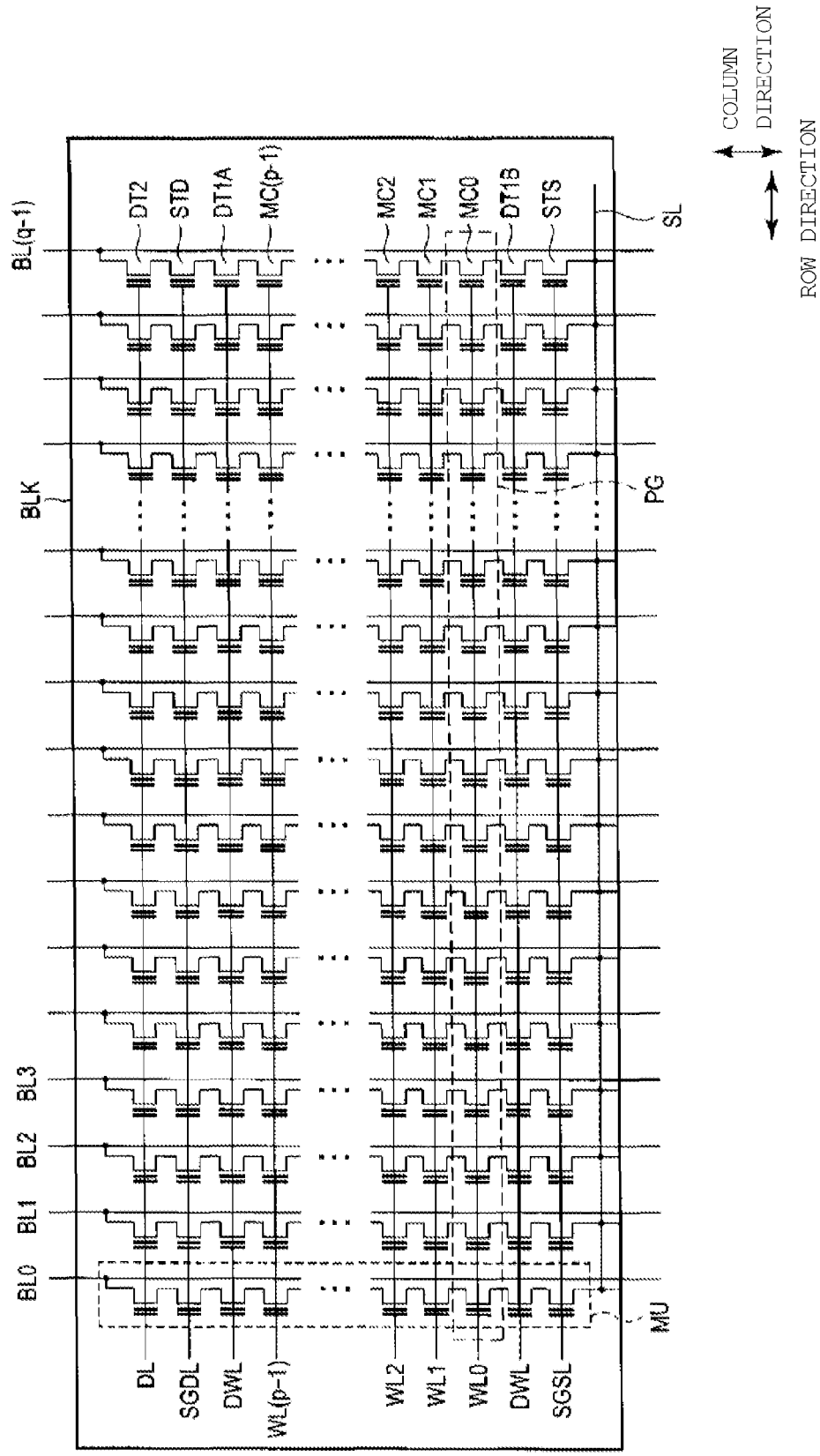
FIG. 2 is an equivalent circuit diagram of a memory block in a semiconductor memory according to a first embodiment.

An internal structure of the memory cell array 100 of FIG. 1 will be described using FIG. 2. FIG. 2 is an equivalent circuit diagram of one block BLK within the memory cell array of the flash memory.

In the NAND-type flash memory, one block BLK is composed of a plurality of memory cell units (hereinafter, referred to as NAND cell unit) MU aligned in a row direction (second direction, row direction). One block BLK contains, for example, the number q of the memory cell units MU.

One memory cell unit MU includes a memory cell string composed of a plurality (for example, the number p) of memory cells MC0 to MC(p−1), a first select transistor STS (hereinafter, referred to as a source-side select transistor) connected to one end of the memory cell string, and a second select transistor STD (hereinafter, referred to as a drain-side select transistor) connected to the other end of the memory cell string. In the memory cell string, the current paths of the memory cells MC0 to MC(p−1) are connected in series in a column direction (first direction).

A source line SL is connected to the memory cell units MU (on the source side) at one end, more specifically, the current paths of the source-side select transistors STS at the end. One of bit lines BL is connected to each of the memory cell units MU (on the drain side) at the other end, namely, the current paths of the drain-side select transistors STD at the end.

Here, the number of the memory cells for forming one memory cell unit MU should be two and more; for example, it may be sixteen, thirty two, or sixty four and more. Hereinafter, when the individual memory cells MC0 to MC(p−1) are not distinguished particularly, they are referred to as memory cell MC.

The memory cell MC is a field-effect transistor of a stack gate structure including a charge storing layer (for example, a floating gate electrode or an insulating film including a trap level). The two memory cells MC adjacent to each other in the column direction are connected to each other by source and drain. According to this, the current paths of the memory cells MC are connected in series, and a memory cell string is formed.

The drain of the source-side select transistor STS is connected to the source of the memory cell MC0. The source of the source-side select transistor STS is connected to the source line SL. The source of the drain-side select transistor is connected to the drain of the memory cell MC (p−1). The drain of the drain-side select transistor STD is connected to one bit line of a plurality of bit lines BL0 to BL(q−1). The number of the bit lines BL0 to BL(q−1) is the same as the number of the memory cell units MU within a block BLK.

Word lines WL0 to WL(p−1) extend in the row direction and each of the word lines WL0 to WL (p−1) is connected in common to the gates of the plural memory cells MC aligned in the row direction. In one memory cell unit MU, the number of the word lines (for example, 128 lines) is the same as the number of the memory cells forming one memory cell string.

A drain-side select gate line SGDL extends in the row direction and is connected in common to the gates of the drain-side select transistors STD arranged in the row direction. A source-side select gate line SGSL extends in the row direction and is connected in common to the gates of the source-side select transistors STS arranged in the row direction.

Hereinafter, when the individual bit lines BL0 to BL (q−1) are not distinguished particularly, they are referred to as the bit line BL and when the individual word lines WL0 to WL(p−1) are not distinguished particularly, they are referred to as the word line WL.

The respective memory cells MC store data from the outside by correspondence between the size of a threshold voltage of a transistor (distribution of threshold voltage) and data. The memory cells MC store the data of binary (1 bit) or four-value (2 bit) and more.

Dummy elements DT1A, DT1B, and DT2 are formed within the memory cell array of the flash memory shown in FIG. 2.

The dummy elements DT1A, DT1B, and DT2 are field-effect transistors. In the below, the dummy elements DT1A, DT1B, and DT2 formed of the field-effect transistor are referred to as dummy transistors DT1A, DT1B, and DT2, respectively.

The dummy transistors DT1A and DT1B are formed at one end and the other end of the memory cell string, respectively. The dummy transistors DT1A and DT1B have a gate structure including a charge storing layer, similarly to the memory cell MC.

The dummy transistor DT1A is formed between the drain-side select transistor STD and the terminal memory cell MC(p−1) of the memory cell string. The source of the drain-side select transistor STD is connected to the drain of the memory cell MC0, passing through the current path of the dummy transistor DT1A. The gate of the dummy transistor DT1A is connected to a dummy word line DWL on the drain side of the memory cell unit MU.

The dummy transistor DT1B is formed between the source-side select transistor STS and the terminal memory cell MC0 of the memory cell string. The drain of the source-side select transistor STS is connected to the source of the memory cell MC0, passing through the current path of the dummy transistor DT1B. The gate of the dummy transistor DT1B is connected to the dummy word line DWL on the source side of the memory cell unit MU.

In order to control a potential of the dummy word line DWL, a dummy word line driver 28 is provided within the row control circuit 210. The dummy word line driver 28 controls the operation (On and Off) of the dummy transistors DT1A and DT1B.

The dummy transistors DT1A and DT1B are formed between the select transistors STD and the memory cell MC(p−1) and between the select transistors STS and the memory cell MC0, respectively. These dummy transistors DT1A and DT1B can suppress a gate-induced drain leakage (GIDL) generated by the electric field between the adjacent elements and improve the process margin in lithography.

When the dummy transistors DT1A and DT1B between the memory cells MC and the select transistors STS and STD are not distinguished individually, they are referred to as a dummy transistor DT1. For the sake of clarification, the dummy transistors DT1A and DT1B between the respective memory cells MC and the respective select transistors STD and STS are referred to as the dummy cells DT1A and DT1B.

A dummy transistor DT2 is formed at the terminal end on the drain side of the memory cell unit. The drain of the drain-side select transistor STD is connected to one bit line BL, passing through the current path of the dummy transistor DT2. One end of the current path of the dummy transistor DT2 is connected to the drain of the drain-side select transistor STD, and the other end thereof is connected to the bit line BL. The gate of the dummy transistor DT2 is connected to a dummy line DL.

In order to control a potential of the dummy line DL, a dummy line driver 29 is formed within the row control circuit 210. The dummy line driver 29 controls the operation (On and Off) of the dummy transistor DT2.

A timing of rising up and down of potential of the dummy word lines DWL and the dummy line DL is properly designed so that the dummy transistors DT1 and DT2 may turn on and off at a predetermined timing according to the operation of the flash memory.

The structure of a flash memory including the dummy transistors according to the embodiment will be described using FIGS. 3 to 5.

Figure 3:
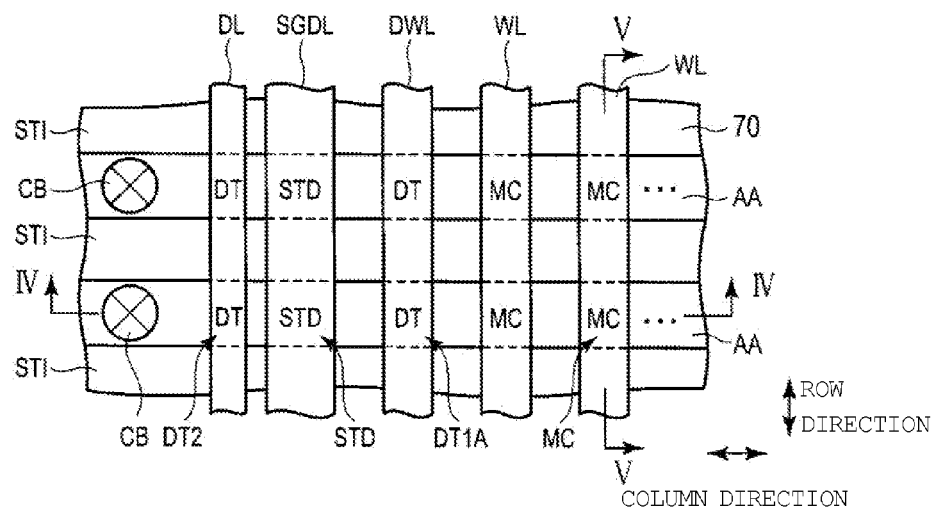
FIG. 3 illustrates a top view of the semiconductor memory according to the first embodiment.

FIG. 3 is a top view of the memory cell array in the flash memory according to the embodiment. FIG. 4 is a cross-sectional view of the flash memory taken along the line IV-IV in FIG. 3. FIG. 5 is a cross-sectional view of the flash memory taken along the line V-V in FIG. 3. FIGS. 3 to 5 show a structure of the memory cell unit on the drain side.

As shown in FIG. 3, active regions AA and element isolation regions STI are formed in the semiconductor substrate 70. Each active region AA extends in the column direction. Each element isolation region STI extends in the column direction.

One active region AA is formed between the two element isolation regions STI that are adjacent to each other in the row direction.

The word line WL is formed above the semiconductor substrate 70. The word line WL extends in the row direction. The memory cells MC are formed respectively at the intersections of the word line WL and the active regions AA.

The drain-side select gate SGDL extends in the row direction. The drain-side select transistors STD are formed respectively at the intersections of the drain-side select gate line SGDL and the active regions AA.

The dummy word line DWL extends in the row direction. The dummy word line DWL is formed between the drain-side select gate line SGDL and the word line WL, above the semiconductor substrate 70.

The dummy cells DT1A on the drain side (dummy transistor) of the memory cell unit are formed respectively at the intersections of the dummy word line DWL and the active regions AA.

A contact plug (hereinafter, referred to as a bit line contact) CB connected to a bit line is formed in each of the active regions at one end. A plurality of bit line contacts CB are arranged on a straight line or in a zigzag shape, in the row direction. The bit line contacts CB connected to the respective bit lines BL are electrically isolated from each other such that each corresponds to one of the memory cell units arranged in the column direction.

The dummy line DL is formed between the bit line contacts CB arranged in the row direction and the select gate line SGDL, above the semiconductor substrate 70. The dummy line DL extends in the row direction. The dummy transistors DT2 are formed respectively at the intersections of the dummy line DL and the active regions AA.

Figure 4:
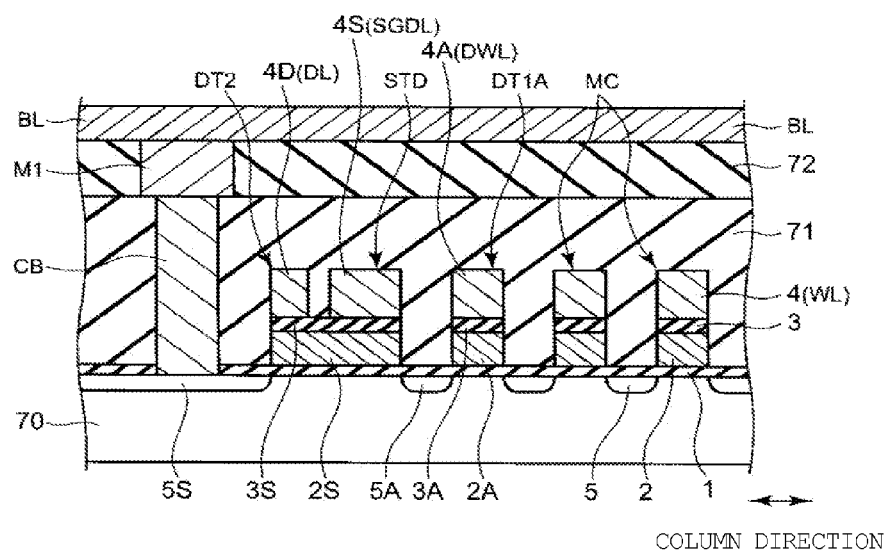
FIG. 4 illustrates a cross sectional structure of the semiconductor memory according to the first embodiment.
Figure 5:
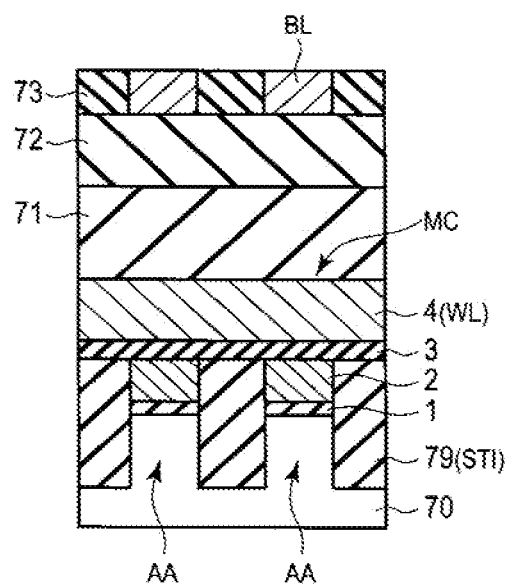
FIG. 5 illustrates another cross sectional structure of the semiconductor memory according to the first embodiment.

As shown in FIGS. 4 and 5, the memory cells MC are arranged within the memory cell array 100.

As described above, the memory cell MC is a field-effect transistor of a stack gate structure including a charge storing layer. The gate of the memory cell MC includes a gate insulating film (tunnel insulating film) 1 on the semiconductor substrate (active region) 70, a charge storing layer 2 formed on the gate insulating film 1, an insulating film (referred to as an inter-gate insulating film or a block insulating film) 3 formed on the charge storing layer 2, and a control gate electrode 4 formed on the insulating film 3.

In the example shown in FIGS. 4 and 5, the charge storing layer 2 is formed of, for example, conductive silicon. The charge storing layer 2 formed of silicon is referred to as a floating gate electrode 2. For example, a film thickness of the floating gate electrode 2 is set at 100 nm or less.

Here, the charge storing layer 2 may be formed of an insulating film (for example, silicon nitride) including an electron trap level.

The control gate electrodes 4 extend in the row direction, and shared by the plural memory cells MC arranged in the row direction. Each of the control gate electrodes 4 is used as the word line WL.

The control gate electrode 4 may have a single layer structure of a silicide layer such as a nickel silicide layer and a tungsten silicide layer (for example, full silicide structure), a stacked structure of a silicide layer and a silicon layer (for example, polycide structure), a single layer structure of a metal layer such as a tungsten layer, and a stacked structure of a metal layer and a silicon layer.

A single layer structure including one of a silicon oxide film, a silicon nitride film, and a high dielectric constant film (High-k film) or a multi-layer structure including some of those films is used for the insulating film 3, which is formed between the floating gate electrode 2 and the control gate electrode 4. Hereinafter, the insulating film between the floating gate electrode 2 and the control gate electrode 4 is referred to as an inter-gate insulating film 3.

As shown in FIG. 5, in the memory cell array, an element isolation insulating film 79 of a shallow trench isolation (STI) structure is embedded into the element isolation region STI within the semiconductor substrate 70. The element isolation insulating film 79 sections a region of the semiconductor substrate 70 into the active regions AA, and the floating gate electrodes 2 arranged in the row direction are electrically isolated from each other such that each corresponds to one of the memory cells MC.

In a direction vertical to the surface of the semiconductor substrate 70, the upper end of the floating gate electrode 2 is positioned at the substantially same level as the upper end of the element isolation insulating film 79.

In this case, the bottom surface of the inter-gate insulating film 3 is into contact with the top surface of the floating gate electrode 2 and the top surface of the element isolation insulating film 79. The whole lateral surface of the floating gate electrode 2 is in contact with the element isolation insulating film 79. Thus, the lateral surface of the floating gate electrode 2 in the row direction is not covered with the inter-gate insulating film 3.

A diffusion layer (hereinafter, referred to as a source/drain diffusion layer) 5 that serves as a source and drain of the memory cell MC is formed in the semiconductor substrate 70 at a proper position with respect to the gate electrodes 2 and 4 of the memory cell MC in the semiconductor substrate 70. The two memory cells adjacent to each other in the column direction share the source/drain diffusion layer 5. By sharing the source/drain diffusion layer 5 between the two memory cells MC, the current paths of the memory cells MC are connected in series.

Hereinafter, a region where the memory cell is provided will be referred to as a memory cell region.

The drain-side select transistor STD of the memory cell unit is formed between a region where the bit line contact CB is formed (referred to as a contact plug region) and the memory cell region, on the semiconductor substrate (active region) 70.

The gate electrodes 2S and 4S of the drain-side select transistor STD have the similar structure to the stack gate structure of the memory cell MC.

The drain-side select transistor STD includes the gate insulating film 1 on the semiconductor substrate 70, a first electrode layer (the gate electrode) 2S on the gate insulating film 1, an insulating film 3S on the first electrode layer 2S, and a second electrode layer (gate electrode) 4S on the insulating film 3S.

The first electrode layer 2S is formed simultaneously with the floating gate electrode 2, and the first electrode layer 2S and the floating gate electrode 2 are made of the substantially same material with the same film thickness. Hereinafter, the first electrode layer 2S on the insulating film 3S of the select transistor STD may be also referred to as a lower electrode layer 2S.

The lower electrode layers 2S arranged in the row direction are electrically isolated from each other by the element isolation insulating film 79 formed in the element isolation region STI.

The insulating film 3S is simultaneously formed with the inter-gate insulating film 3, and the insulating film 3S and the inter-gate insulating film. 3 are made of the substantially same material with the almost same film thickness. Hereinafter, the insulating film 3S formed between the electrode layers 2S and 4S of the select transistor STD may be referred to as the inter-gate insulating film 3S.

The second electrode layer 4S is formed simultaneously with the control gate electrode 4, and the second electrode layer 4S and the control gate electrode 4 are made of the substantially same material with the almost same film thickness. In the below, the second electrode layer 4S on the inter-gate insulating film 3S of the select transistor STD may be also referred to as an upper electrode layer 4S.

The upper electrode layer 4S extends in the row direction and it becomes the common gate of the plural drain-side select transistors STD arranged in the row direction. The upper electrode layer 4S extending in the row direction works as the drain-side select gate line SGDL.

The gate insulating film 1 of the select transistor STD maybe formed of the same material with the same film thickness as those of the gate insulating film 1 of the memory cell MC or may be formed of different material with different film thickness from those of the gate insulating film 1 of the memory cell MC.

The lower electrode layer 2S and the upper electrode layer 4S of the select transistor STD are isolated by the inter-gate insulating film 3S. The lower electrode layer 2S and the upper electrode layer 4S are not directly in contact, in a non-conductive state. The lower electrode layer 2S and the upper electrode layer 4S are capacitively coupled by the inter-gate insulating film 3S. The lower electrode layer 2S of the select transistor STD can store electric charges similarly to the floating gate electrode 2 of the memory cell MC.

Hereinafter, a region where the select transistor is formed is referred to as a select transistor region.

For example, the dummy cell (dummy transistor) DT1A is formed between the memory cell region and the select transistor region on the semiconductor substrate. Therefore, the drain of the memory cell MC is electrically connected to the source of the select transistor STD through a current path of the dummy cell DT1A.

The dummy cell (dummy transistor) DT1A has a substantially same structure as the memory cell MC. Although the dummy cell DT1A has a same structure and thus can function similarly as the memory cell MC, it is not used for storing data.

The dummy cell DT1A includes the gate insulating film (tunnel insulating film) 1 on the semiconductor substrate (active region) 70, a floating gate electrode 2A formed on the gate insulating film 1, an inter-gate insulating film 3A formed on the floating gate electrode 2A, and a control gate electrode 4A formed on the inter-gate insulating film 3A.

The dummy cell DT1A has a source/drain diffusion layer 5A within the semiconductor substrate 70. One of the two source/drain diffusion layers 5A of the dummy cell DT1A is shared by the adjacent memory cell MC and the other thereof is shared by the adjacent drain-side select transistor STD.

The control gate electrode 4A of the dummy cell DT1A extends in the row direction and is shared by the plural dummy cells DT1A arranged in the row direction. The control gate electrode 4A of the dummy cell DT1A functions as the dummy word line DWL. The floating gate electrodes 2A of the dummy cells DT1A are electrically isolated from each other such that each corresponds to one of the dummy cells DT1A. For the sake of clarification, the floating gate electrode 3A of the dummy cell DT1A may be also referred to as a dummy electrode 3A.

In the embodiment, the dummy line DL is formed between a contact plug region and the select transistor region on the semiconductor substrate 70.

The dummy transistor DT2 connected to the dummy line DL is formed at a position of the dummy line DL. The dummy transistor DT2 is a transistor formed by the dummy line DL being arranged on the lower electrode layer 2S of the select transistor STD. In a flash memory in which the dummy line DL is formed between the select transistor STD and the bit line contact CB, dummy transistor DT2 partially works as a connection between the memory cell unit and the bit line contact CB.

The dummy transistor DT2 includes the first electrode layer (lower electrode layer) 2S shared by the select transistor STD, the inter-gate insulating film 3S shared by the select transistor STD, and a third electrode layer 4D formed above the lower electrode layer 2S, with the inter-gate insulating film 3S being formed in between.

The upper electrode layer 4D of the dummy transistor DT2 is formed simultaneously with the upper electrode layer 4S of the select transistor STD, and the second electrode layer 4S and the control gate electrode 4 are formed of the substantially same material with the almost same film thickness.

The current path of the dummy transistor DT2 is connected to the bit line contact CB and the bit line BL through the diffusion layer 5S as a drain of the dummy transistor DT2. The current path of the select transistor STD is connected to the bit line contact CB and the bit line BL through the current path of the dummy transistor DT2.

When the select transistor STD and the dummy transistor DT2 are turned on, a channel formed within a channel region (semiconductor substrate) under the gate electrode 2S of the select transistor STD is coupled to a channel formed within a channel region under the gate electrode 2S of the dummy transistor DT2. According to this, the drain of the memory cell unit is connected to the bit line BL.

With respect to structures of gates in the select transistor STD and the dummy transistor DT2, the two separated upper electrode layers 4S and 4D are formed above the lower electrode layer 2S which is continuously formed in the select transistor STD and the dummy transistor DT2.

For example, with respect to the two upper electrode layers 4S and 4D formed above the lower electrode layer 2S, a width of the upper electrode layer 4S of the select transistor STD in a direction along the bit line BL (line width of the select gate line SGDL) is greater than a width of the upper electrode layer 4D of the dummy transistor DT2 (line width of the dummy line DL). As the width of the upper electrode layer 4S of the select transistor STD become greater, a resistance value of the select gate line SGDL is reduced.

By making the width of the upper electrode layer 4S of the select transistor STD greater than the width of the upper electrode layer 4D of the dummy transistor DT2, the channel formed below the lower electrode layer 2S depends mainly on a driving characteristic of the select transistor STD. As the result, even if the dummy line DL is formed between the select gate line SGDL and the contact plug CB, a connection of the memory cell unit and the bit line can be controlled relatively easily.

For example, in the lower electrode layer 2S shared by the select transistor STD and the dummy transistor DT2, the width of the lower electrode layer 2S along the bit line BL (gate length) is set at, for example, 100 nm to 120 nm. Here, according to miniaturization of the memory cell, the size of the select transistor STD and the dummy transistor DT2 is miniaturized further.

A first inter-layer insulating film 71 is formed on the semiconductor substrate 70. In the memory cell array, the first inter-layer insulating film 71 cover the memory cell MC, the select transistor STD, and the dummy cells DT1A and DT2 in FIG. 4. A bit line contact CB is embedded into a contact hole formed in the first inter-layer insulating film 71. The bit line contact CB is connected to the diffusion layer 5S formed in the semiconductor substrate 70.

The diffusion layer 5S is connected to an intermediate wiring M1 formed on the first inter-layer insulating film 71 through the bit line contact CB. The intermediate wiring M1 is provided within a first wiring level. A second inter-layer insulating film 72 is formed on the first inter-layer insulating film 71. The intermediate wiring M1 is provided within the second inter-layer insulating film 72.

A third inter-layer insulating film 73 is stacked on the second inter-layer insulating film 72. Each of the bit lines BL is formed in the inter-layer insulating film 73 to be connected to one of the memory cell units through one of the intermediate wirings M1 and one of the bit line contacts CB.

As described above, in the flash memory according to the embodiment, the lower electrode layer 2S and the upper electrode layer 4S of the select transistor STD are isolated by the inter-gate insulating film 3S.

The film thicknesses of the floating gate electrode 2 and the lower electrode layer 2S become smaller according to the miniaturization of the memory cell MC. When forming an opening in the inter-gate insulating film 3S of the select transistor STD in order to electrically connect the lower electrode layer 2S and the upper electrode layer 4S of the select transistor STD, the thin lower electrode layer 2S may be over-etched and the gate insulating film 1 under the opening may be removed. In this case, the flash memory may function defectively, and therefore reliability and manufacturing yield rate may be compromised.

Accordingly, in the flash memory according to the embodiment, such an opening for electrically connecting the lower electrode layer 2S and the upper electrode layer 4S of the select transistor STD is not formed in the inter-gate insulating film 3S of the select transistor STD.

In this case, since the lower electrode layer 2S of the select transistor STD has the same function as the floating gate electrode 2 of the memory cell MC, electric charges are injected in the lower electrode layer 2S in a floating state of the select transistor STD, and a threshold voltage of the select transistor STD has to be set.

A setting of the threshold voltage of the select transistor STD is performed by applying a writing voltage of about 20 V to the gate electrode (upper electrode layer 4S) of the select transistor STD, similarly to the writing of data to the memory cell MC.

At the setting of the threshold voltage of the select transistor STD, an intermediate voltage Vpass of about 10 V is applied to the dummy line DL between the bit line contact CB and the select transistor STD. By applying the intermediate voltage to the dummy line DL, the dummy transistor DT2 including the gate connected to the dummy line DL is turned on.

By applying the voltage of about 10 V to the dummy line DL, a potential difference between the bit line contact CB and the dummy line DL becomes about 10 V. Compared to the case of applying the potential difference of 20 V between the bit line contact CB and the select gate line SGDL without the application of the intermediate voltage to the dummy line DL, the potential difference applied between the bit line contact CB and the adjacent wiring becomes smaller.

Thus, when the threshold voltage for the select transistor STD is set, a voltage applied to the dummy line DL formed between the bit line BL and the select gate line SGDL becomes a relaxation voltage between the bit line contact CB and the select gate line SGDL. Hence a possibility of a dielectric breakdown between the bit line contact CB and the select gate line SGDL is reduced.

Here, a voltage to be applied to the dummy line DL may be any voltage other than 10 V as long as it can relieve a potential difference between the contact plug (bit line contact) CB and the select gate line SGDL and prevent a dielectric breakdown between the select gate line SGDL and the dummy line DL.

At a time of writing in the select transistor STD, with respect to the dummy cell DT1A between the memory cell MC and the select transistor STD, the intermediate potential Vpass of about 10 V is applied to the dummy word line DWL connected to the gate of the dummy cell DT1A. The voltage to be applied to the dummy word line DWL is not restricted as long as it can relieve a potential difference between the word line WL and the select gate line SGDL.

Further, at a time of writing in the select transistor STD, a voltage of 0 V is applied to the word lines WL and a voltage of 0 V or a drive voltage Vdd is applied to the bit line BL. A voltage applied to the word line WL at a time of setting the threshold voltage of the select transistor STD may be more than 0 V, depending on the structure of the circuit.

It is preferable that an amount of electric charges injected to the lower electrode layer 2S shared by the dummy transistor DT2 and the select transistor STD is adjusted so that the dummy transistor DT2 between the select transistor STD and the bit line contact CB may be turned on, for example, with a voltage of 2 to 3 V, in a reading operation of the flash memory. Further, the threshold voltage of the dummy cell DT1A is adjusted so that the dummy cell DT1A may be driven with a voltage of 4 to 5 V, in the reading operation of the flash memory. Here, the dummy cell DT1A is preferably set at a threshold in an erasable state.

According to the flash memory of the embodiment, the dummy line DL and the dummy transistor DT2 connected to the dummy line DL are formed between the select transistor STD on the bit line side of the memory cell unit and the bit line contact CB.

In the embodiment, when a large voltage (for example, writing voltage of about 20 V) is applied to the gate electrodes (select gate lines) 25 and 4S of the select transistor STD, in order to set and adjust the threshold voltage of the select transistor STD (in a non-conductive state of the lower electrode layer 2S and the upper electrode layer 4S) in which the lower electrode layer 2S and the upper electrode layer 4S are isolated, a smaller voltage (for example, voltage of about 10 V) is applied to the dummy line DL (the gate electrode 4D of the dummy transistor), than the voltage applied to the gate electrodes 25 and 4S of the select transistor STD.

According to this, when a large voltage (writing voltage) is applied to the select gate line SGDL to which the select transistor STD is connected, in order to inject the electric charges to the lower electrode layer 2S of the select transistor STD in a floating state, a possibility of a dielectric breakdown between the bit line contact CB and the gate electrodes 25 and 4S of the select transistor STD can be reduced.

Accordingly, when the lower electrode layer 2S and the upper electrode layer 4S of the select transistor STD are not electrically connected to each other, through the writing into the select transistor STD is required, the flash memory of the embodiment can relieve an electric field between the bit line contact CB and the gate electrode 4S of the select transistor STD in the writing.

As mentioned above, according to the flash memory of the embodiment, an electric field among the wirings can be relieved.

(b) Manufacturing Method

Figure 6:
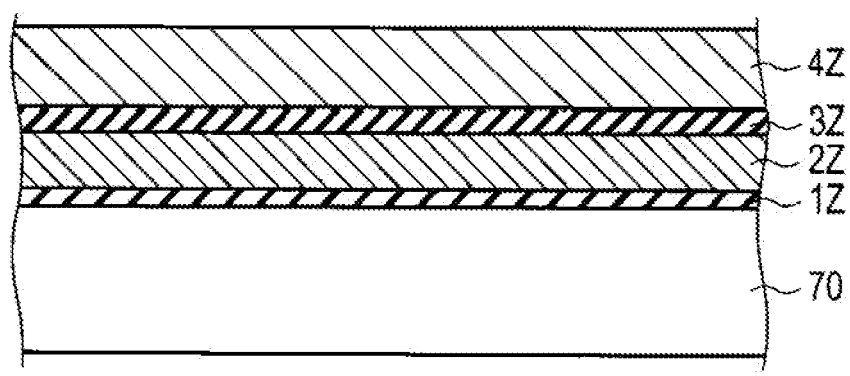
FIG. 6 describes steps of a method for manufacturing the semiconductor memory according to the first embodiment.
Figure 7:
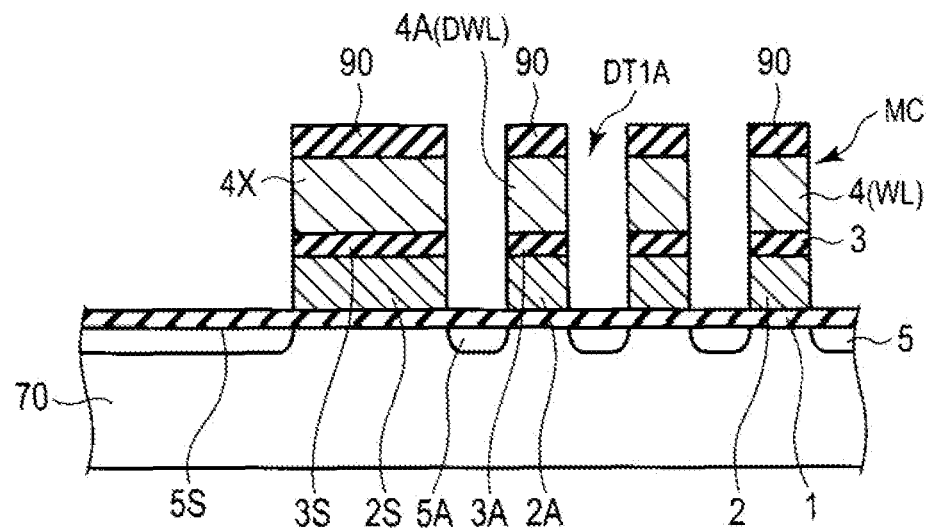
FIG. 7 describes the steps, following the steps described in FIG. 6, of the method for manufacturing the semiconductor memory according to the first embodiment.
Figure 8:
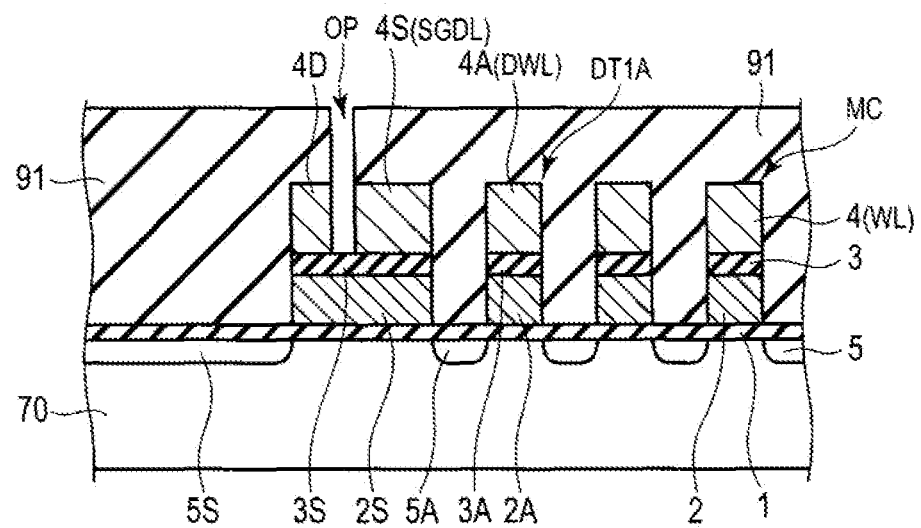
FIG. 8 describes steps, following the steps described in FIG. 7, of the method for manufacturing the semiconductor memory according to the first embodiment.

With reference to FIGS. 6 to 8, a method of manufacturing a semiconductor memory (flash memory) according to the first embodiment will be described. Here, the method of manufacturing the flash memory of the embodiment will be described also with reference to FIGS. 1 to 5.

FIG. 6 describes steps of the method of manufacturing the flash memory according to the embodiment. FIG. 6 shows a cross sectional structure of layers in the column direction at a time of manufacturing the flash memory.

As shown in FIG. 6, a gate insulating film 1Z used for the memory cells, the select transistor, and the dummy transistor is formed on the surface of the semiconductor substrate 70 where a well region (not shown) is formed by performing the thermal oxidation, nitridation, or Atomic layer Deposition (ALD) on a silicon substrate.

A charge storing layer 2Z used for the memory cells is deposited on the gate insulating film 1Z. When a floating gate electrode is used in the memory cell, a polysilicon film 2Z is deposited on the gate insulating film 1Z as the charge storing layer, employing the CVD method.

A silicon nitride film (not shown), for example, is deposited on the polysilicon film 2Z as a hard mask, employing the CVD method. The silicon nitride film is patterned in accordance with the shape of the active region, using the lithography, the liquid immersion lithography, or fine patterning technique such as sidewall transfer technique.

In the memory cell array, the polysilicon film 2Z, the oxide film 1Z, and the semiconductor substrate 70 are sequentially etched, using the silicon nitride film patterned into a predetermined shape as a mask, for example, employing an RIE method. Thus, trenches (element isolation grooves) are formed in the semiconductor substrate 70, and in the memory cell array line-shaped active regions are formed. Each of the active regions and each of the element isolation grooves extends in the channel length direction (column direction) of the transistor. The layout of line and space is formed in the memory cell array of the semiconductor substrate 70, according to the active regions and the element isolation grooves.

An insulator is embedded in the element isolation grooves and an element isolation insulating film (not shown) is formed in the semiconductor substrate 70. The top surface of the element isolation insulating film is etched in such a way that, for example, the position of the upper end of the isolation insulating film substantially is the same as the position of the upper end of the polysilicon film 2Z.

After a portion of the silicon nitride film formed on the polysilicon film 2Z is selectively removed, the insulating film 3Z for forming the inter-gate insulating films of the memory cells is formed on the polysilicon film 2Z and the element isolation insulating film, employing, for example, the CVD or ALD. One of a silicon oxide film, a multi-layer film including a silicon oxide film and a silicon nitride film, a single-layer film of a high dielectric constant insulating film (high-k film), and a multi-layer film including a high dielectric constant insulating film is formed as the insulating film 3Z.

The conductive film 4Z is deposited on the insulating film 3Z. The conductive film 4Z is made of polysilicon film. A tungsten film may be formed as the conductive film 4Z.

FIG. 7 describes the following steps of the method for manufacturing the flash memory according to the embodiment. FIG. 7 shows the cross sectional structure of layers in forming the flash memory.

As shown in FIG. 7, a mask layer 90 is deposited on the conductive film 4Z. The mask layer 90 is patterned in accordance with a predetermined gate pattern, using the lithograph, the liquid immersion lithography, or the sidewall transfer technique. The mask layer 90 has a straight-line-shaped pattern extending in the row direction in the memory cell array. Based on the patterned mask layer 90, the layers for forming the gate electrodes of the transistors are sequentially etched employing the RIE method.

According to this etching, the floating gate electrodes 2, the inter-gate insulating films 3, and the control gate electrodes 4 (word line WL) of the memory cells MC are formed. In addition, the floating gate electrodes (dummy electrodes) 2, the inter-gate insulating films 3, and the control gate electrodes 4 (dummy word line DWL) of the dummy cells (dummy transistors) DT1A are formed.

Further, the lower electrode layers 2S, each shared by the select transistor and the dummy transistor, are formed. Here, the conductive film 4X formed on the lower electrode layer 2S of the select transistor ST is not yet processed to be divided into the upper electrode layer of the dummy transistor and the upper electrode layer of the select transistor.

Using the formed conductive films 4, 4A, and 4X as a mask, the diffusion layers 5, 5A, and 5S are formed in the semiconductor substrate 70 as the source/drain. For example, a sidewall insulating film (not shown) is formed on the lateral surfaces of the gate electrodes of the respective transistors.

FIG. 8 describes the following steps of the method for manufacturing the flash memory according to the embodiment. FIG. 8 shows the cross sectional structure of the memory cell array in the column direction in forming the flash memory.

As shown in FIG. 8, an insulating film 91 is deposited on the semiconductor substrate 70, employing, for example, the CVD method, in order to cover the gate pattern of the transistors formed on the semiconductor substrate 70.

Employing the lithography, an opening OP is formed in the insulating film 91 (or the mask layer on the insulating film 91), at a position between the upper electrode layer 4S of the select transistor STD and the upper electrode layer 4D of the dummy transistor DT2. The opening OP has a straight-line-shaped pattern extending in the row direction in the memory cell array.

Using the inter-gate insulating film 3S in the select transistor region as an etching stopper, the conductive film 4X is etched, in accordance with the pattern of the openings OP formed in the insulating film 91.

According to this, the conductive film 4X formed above the lower electrode layer 2S is divided into two, hence to form the upper electrode layer 4S of the select transistor STD and the upper electrode layer 4D of the dummy transistor DT2.

The step of forming the upper electrode layer 4S of the select transistor STD and the upper electrode layer 4D of the dummy transistor DT2 is substantially performed, for example, simultaneously with a step of processing gates of the peripheral transistors in the peripheral circuit region.

According to the steps described above, the dummy transistor DT2 is formed between the select transistor STD and the contact plug CB. Since the dummy transistor DT2 shares the lower electrode layer 2S with the select transistor STD, the number of the manufacturing steps of the flash memory does not increase excessively.

In the embodiment, the step of forming the upper electrode layer 4S of the select transistor STD and the upper electrode layer 4D of the dummy transistor DT2 on one lower electrode layer 2S is not restricted to the process explained with FIG. 8. The step may be performed simultaneously at a step of processing gates of the memory cells or in any other steps.

After the upper electrode layer 4S of the select transistor STD and the upper electrode layer 4D of the dummy transistor DT2 are formed, the insulating film 90 is removed.

As shown in FIG. 4, the inter-layer insulating film 71 is deposited on the semiconductor substrate 70 in order to cover the memory cells MC, the select transistor STD, and the dummy transistors DT1 and DT2.

For example, when a silicide layer is formed as the gate electrode of each transistor that becomes a wiring (control line) extending in a direction, like the control gate electrode (word line) 4 of the memory cells MC, the top of the inter-layer insulating film 71 is removed so that the top surfaces of the gate electrodes 4, 4A, 4S, and 4D of the respective transistors may be exposed. A metal film is deposited on the exposed gate electrodes 4, 4A, 4S, and 4D, and the silicide processing is performed on the top surfaces of the gate electrodes and the metal film. According to this, the metal film reacts with the polysilicon film on the top surface of the gate electrode (silicide reaction), and then a silicide layer is formed. The insulating film 91 of FIG. 8 may be used as the inter-layer insulating film 71.

A contact hole is formed in the inter-layer insulating film 71 to expose the diffusion layer 5S at a position to form the bit line contact. The bit line contact CB is embedded into the contact hole.

The inter-layer insulating film 72 and the intermediate wiring M1 connected to the bit line contact CB is formed on the inter-layer insulating film 71.

The bit line BL is formed on the intermediate wiring M1 and the inter-layer insulating film 72.

According to the above manufacturing processes, the flash memory of the embodiment is manufactured.

After a package process and a test process on the manufactured flash memory are performed, the writing operation (electric charge injection into the lower electrode layer) into the select transistor for setting the threshold voltage of the select transistor is performed.

As mentioned above, an intermediate voltage of about 10 V is applied to the dummy line DL between the select gate line SGDL and the bit line contact CB, as a relaxation voltage. The intermediate voltage of about 10 V is applied to the dummy word line DWL between the select gate line SGDL and the word line WL as the relaxation voltage. The writing voltage of about 20 V is applied to the select gate line SGDL. A voltage of 0 V or more is applied to the word line WL. A voltage of 0 V to 3 V is applied to the bit line BL.

According to this, the electric charges are injected in the lower electrode layer 2S, which is in a floating state, of the select transistor STD, and the threshold voltage of the select transistor STD, in which the lower electrode layer 2S and the upper electrode layer 4S are electrically isolated, is adjusted.

At a time of writing into the select transistor, a volume of each voltage to be applied to the wirings DL, DWL, WL, and SGDL and a timing of applying a voltage to the respective wirings DL, DWL, WL, and SGDL may be properly changed depending on the circuit structure of the flash memory and the element size of the respective transistors.

The lower electrode layer 2S of the select transistor STD is also used as the lower electrode layer 2S of the dummy transistor DT2. Therefore, it is preferable that the electric charges to be injected into the lower electrode layer 4S should be adjusted in accordance with the On characteristic of the dummy transistor DT2.

As mentioned above, a flash memory is manufactured according to the method for manufacturing the flash memory according to the embodiment.

In the flash memory manufactured according to the manufacturing method of the embodiment, the dummy line DL and the dummy transistor DT2 having a gate connected to the dummy line DL are formed between the select transistor (for example, the select transistor on the drain side) STD where the lower electrode layer 2S and the upper electrode layer 4S are isolated and the contact plug (for example, bit line contact) CB.

According to the manufacturing method of the embodiment, at a time of setting the threshold voltage of the select transistor STD, a voltage smaller than the writing voltage is applied to the dummy line DL (the gate electrode of the dummy transistor DT2) formed between the select transistor STD and the contact plug CB.

This can relieve a large potential difference between the select gate line SGDL and the bit line contact CB when the threshold voltage of the select transistor is set.

As a result, the flash memory manufactured according to the manufacturing method of the embodiment can suppress a dielectric breakdown between the select gate line SGDL and the bit line contact CB.

(2) Second Embodiment

Figure 9:
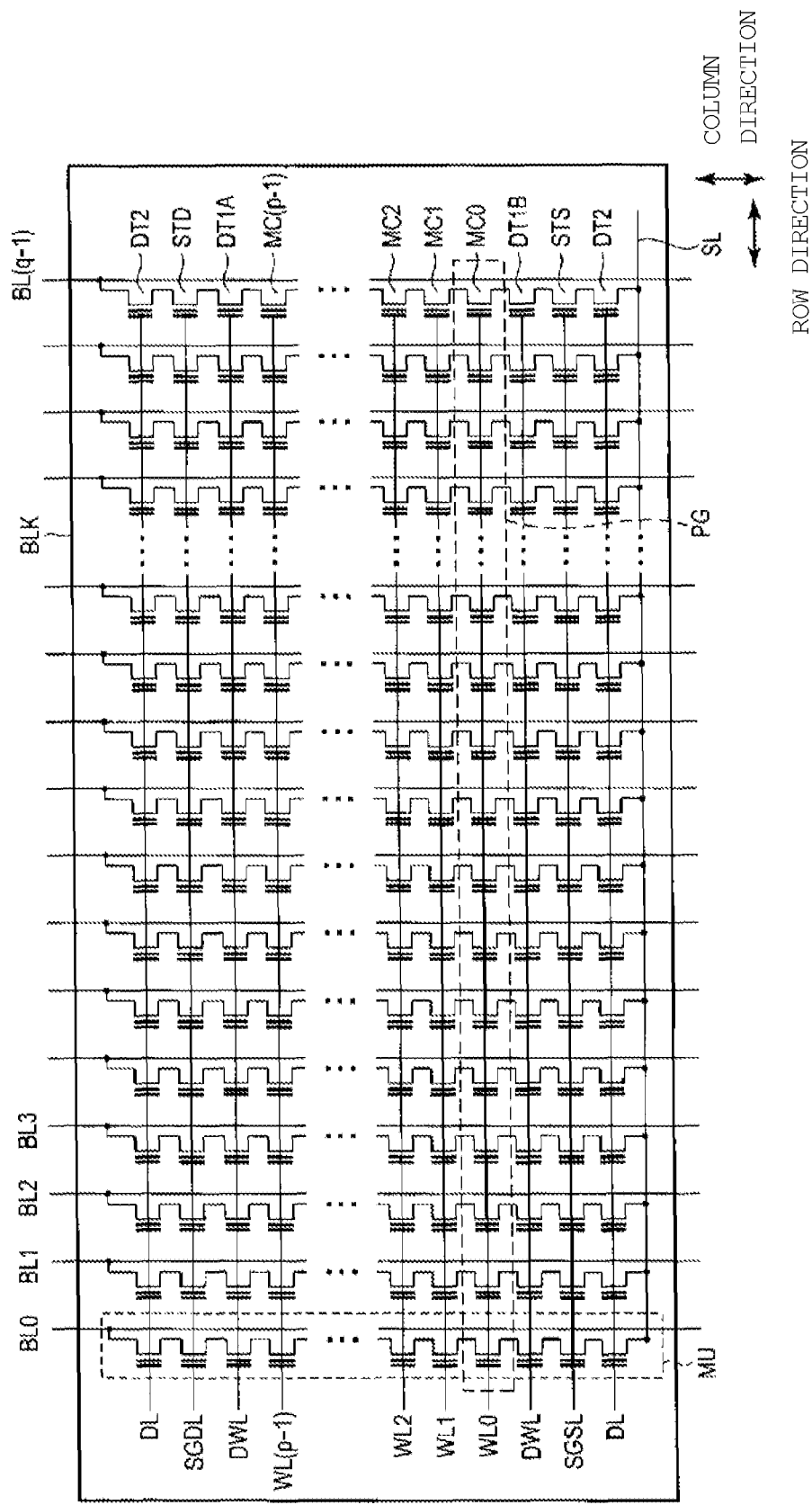
FIG. 9 is an equivalent circuit diagram of a semiconductor memory according to a second embodiment.
Figure 10:
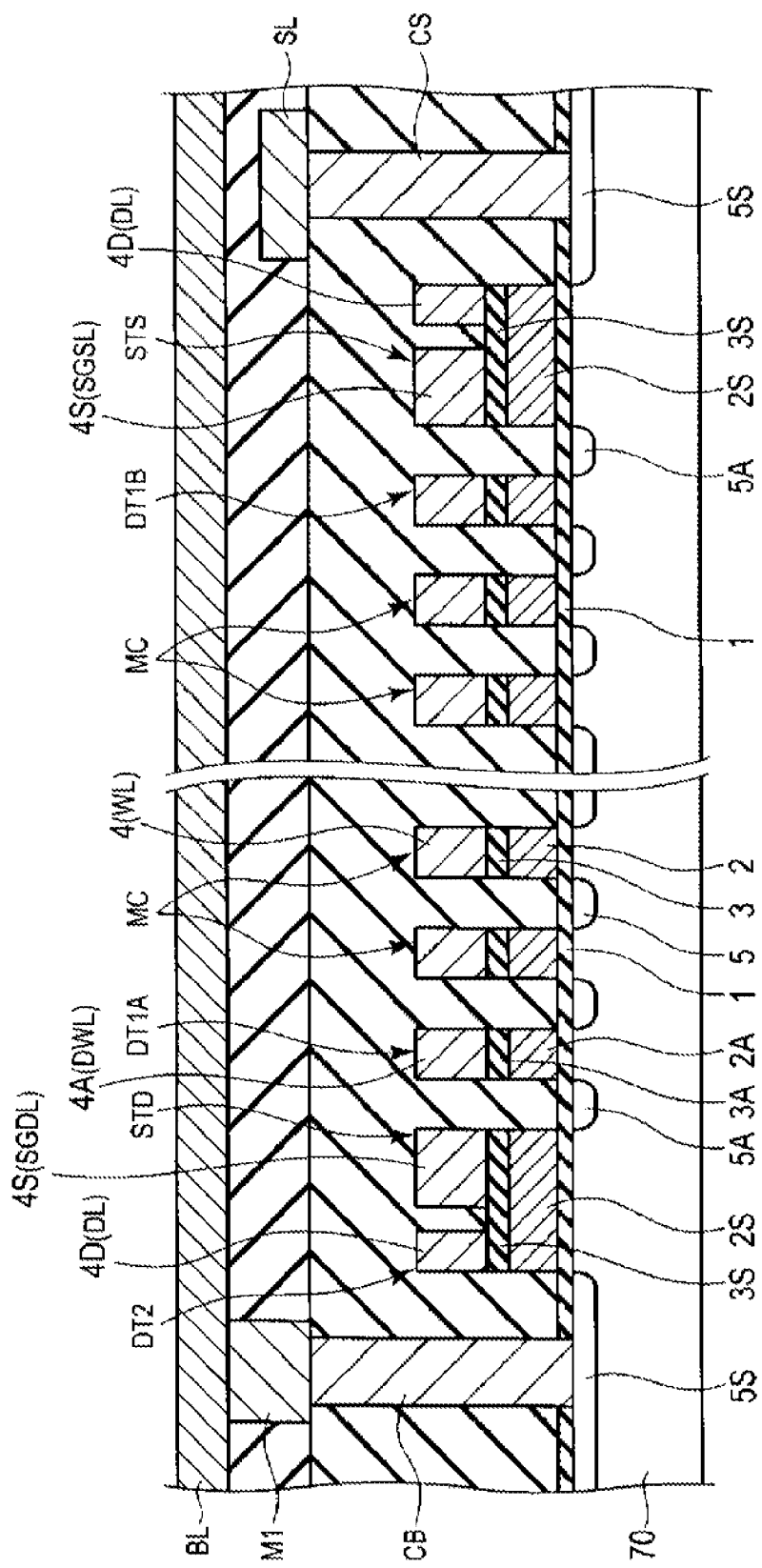
FIG. 10 is a cross sectional view of the semiconductor memory according to the second embodiment.

Referring to FIGS. 9 and 10, a flash memory according to a second embodiment will be described.

Here, the description about the same structure as having been described in the first embodiment is omitted in this embodiment.

FIG. 9 is an equivalent circuit diagram showing the memory cell array of a flash memory according to the embodiment. FIG. 10 is a view showing the cross sectional structure of the flash memory according to the embodiment.

As shown in FIGS. 9 and 10, the dummy line DL and the dummy transistors, each having a source-side gate electrode DT2 connected to the dummy line DL may be formed between the source-side select transistors STS and the source line contacts CS.

The source-side dummy transistors DT2 have the substantially same structure as the dummy transistors DT2 on the drain side.

Each of the source-side dummy transistors DT2 includes the first electrode layer (lower electrode layer) 2S shared with the source-side select transistor STS, the inter-gate insulating film 3S shared with the select transistor STS, and the upper electrode layer 4D provided above the lower electrode layer 2S, with the inter-gate insulating film 3S being formed in between. Each of the upper electrode layers 4D of the source-side dummy transistors DT2 is formed between the source-side select gate line SGSL and one of the source line contacts CS.

The current path of the source side select transistor STS is connected to the source line contact CS, through the current path of the source-side dummy transistor DT2. According to this, one end of the memory cell unit is connected to the source line SL.

Similarly to the drain-side select transistor STD, the lower electrode layer 2S and the upper electrode layer 4S of the source-side select transistor STS are isolated by the inter-gate insulating film 3S, and the lower electrode layer 2S of the source-side select transistor STS is in a floating state. Therefore, in order to set the threshold voltage of the source-side select transistor STS, the writing operation into the source-side select transistor STS is substantially performed according to the same operation as the writing operation into the drain-side select transistor.

Like this embodiment, the dummy transistors DT2 and the dummy line DL are formed between the source-side select transistors STS and the source line contacts CS. According to this, at the time of the writing operation (control of the threshold voltage) into the source-side select transistor STS, a relaxation voltage (for example, about 10 V) is applied to the dummy line DL, and hence a dielectric breakdown between the select transistor STS on the source side and the source line contact CS, caused by the application of the writing voltage can be prevented.

(3) Third Embodiment

Figure 11:
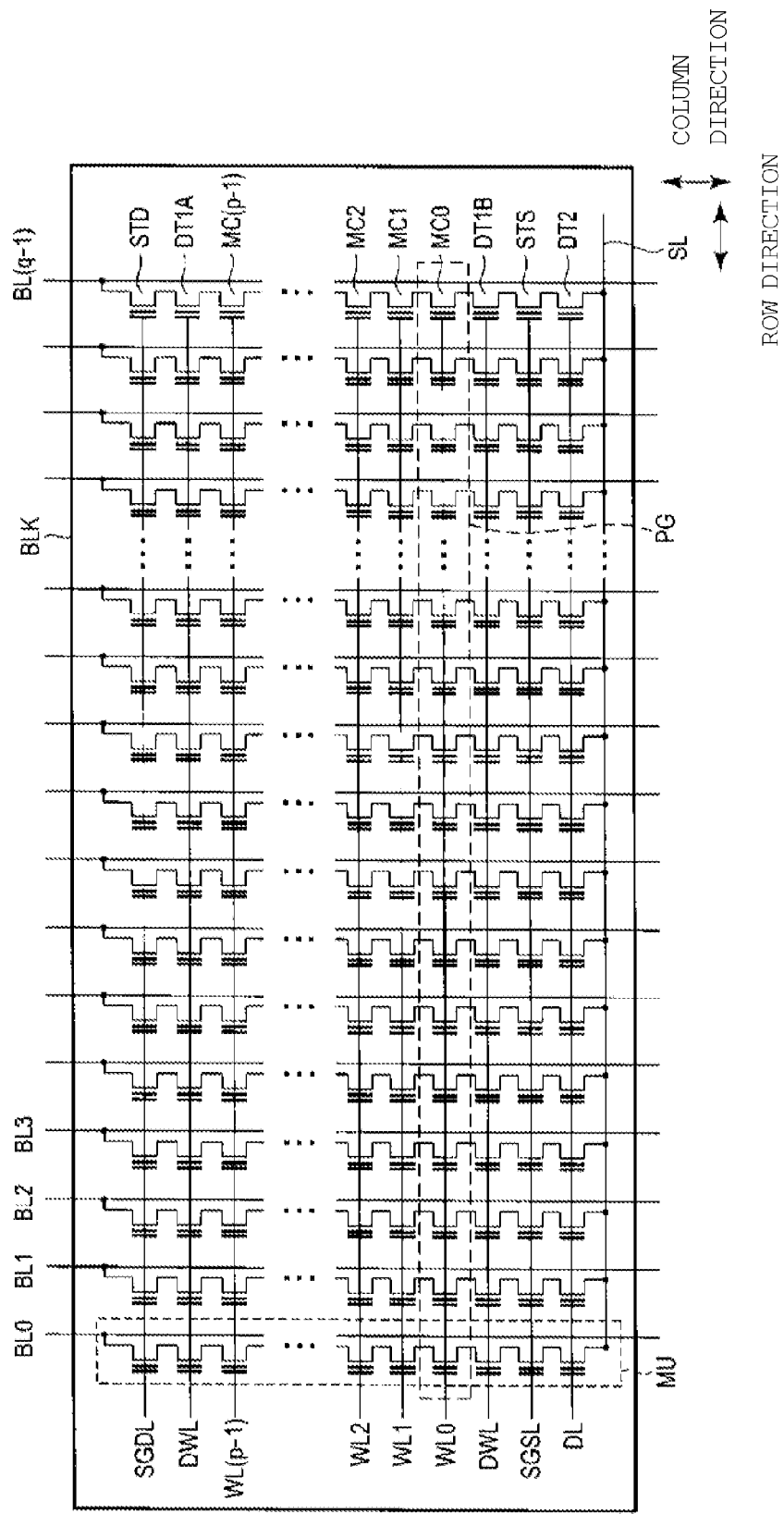
FIG. 11 is an equivalent circuit diagram of a semiconductor memory according to a third embodiment.

FIG. 11 is an equivalent circuit diagram of a flash memory according to a third embodiment.

In the embodiments shown in FIGS. 9 and 10, the dummy transistor DT2 and the dummy line DL are formed both between the bit line contacts CB and the drain-side select transistors STD and between the source line contacts CS and the source-side select transistors STS.

Alternatively, as shown in FIG. 11, the dummy transistor DT2 may be formed only between the source line contacts CS and the source-side select transistors STS.

As mentioned above, the flash memory according to the third embodiment can relieve an electric field between the source line contacts CS and the gate electrodes 4S of the select transistors at a time of writing into the select transistors.

(4) Variation Examples

Figure 12:
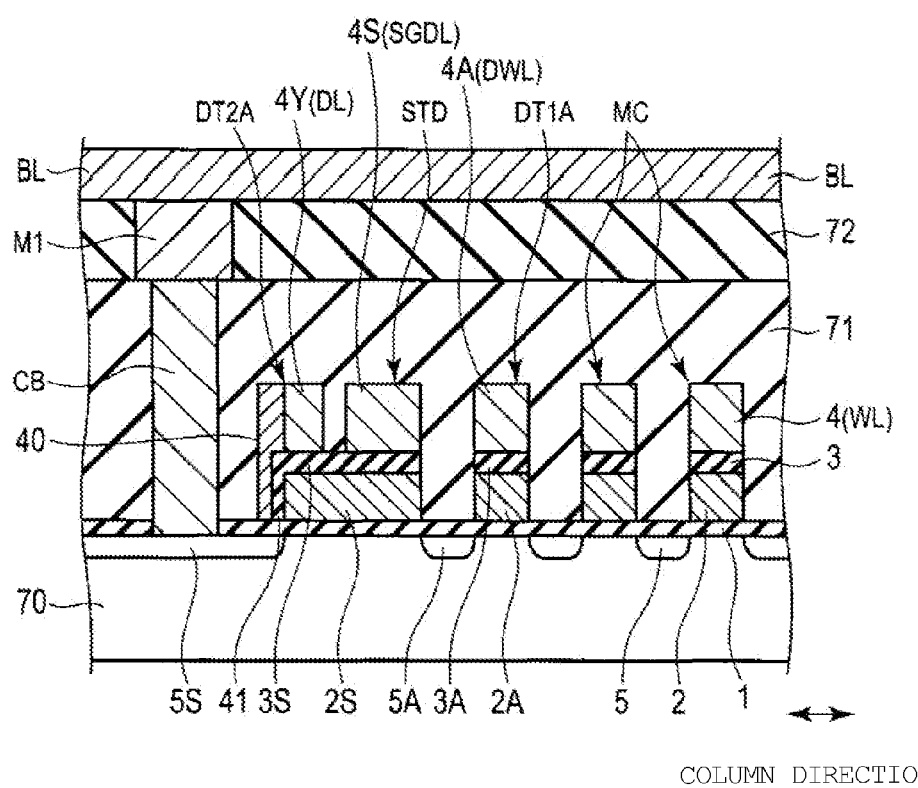
FIG. 12 is a cross sectional view of a variation example of the semiconductor memory according to the embodiment.
Figure 13:
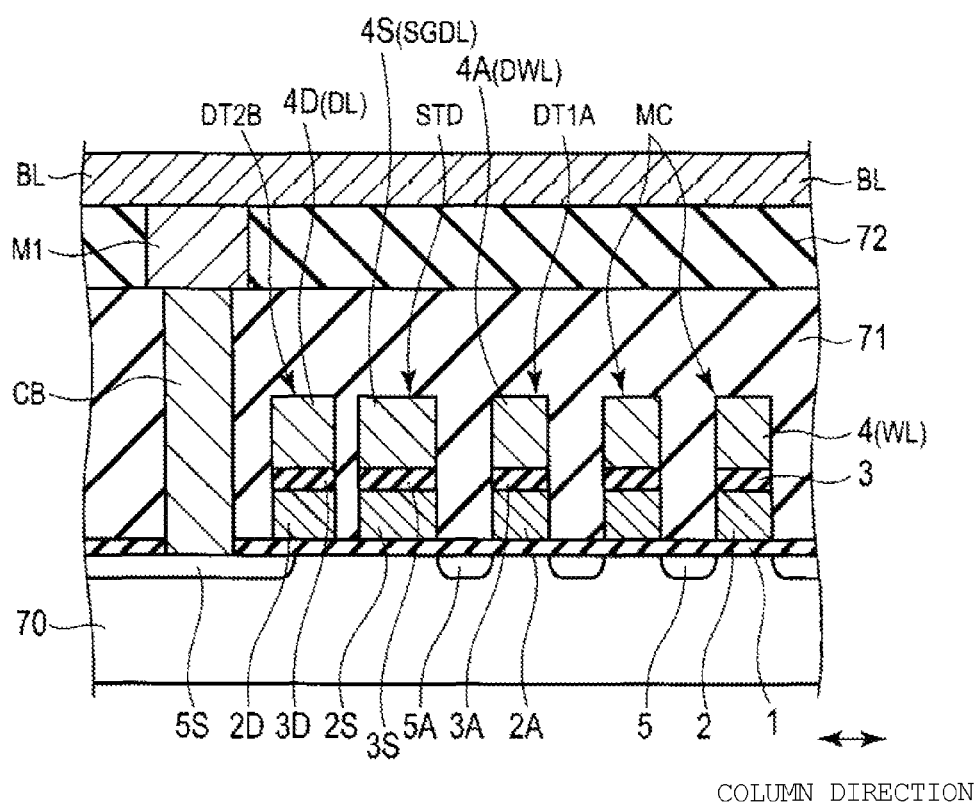
FIG. 13 is a cross sectional view of a variation example of the semiconductor memory according to the embodiment.

Referring to FIGS. 12 and 13, variation examples of the flash memory of the embodiments will be described. In the variation examples, the description about the same structure as having been described in the first, second, and third embodiments is omitted.

FIG. 12 is a view showing a cross sectional structure of a variation example of the flash memory according to one of the embodiments.

As shown in FIG. 12, a conductive layer 40 connected to a lateral surface of an upper electrode 4Y may be provided in the dummy transistor DT2 in order to extend to the lateral surface of the lower electrode layer 2S on the side of the contact CB. A sidewall insulating film 41 is provided between the conductive layer 40 and the lower electrode layer 2S.

According to this, an electric field between the lower electrode 2S and the contact CB can be relieved, and hence the voltage that can be applied to the select transistor STD at a time of writing is increased and flexibility in flash memory design is improved.

As an area spread between the upper electrode layer 4Y and the lower electrode layer 2S of the dummy transistor DT2 becomes larger, an effect of the upper electrode 4S for controlling the current flowing through a channel below the lower electrode layer 2S becomes smaller. Therefore, the structure of the dummy cell has to be preferably modified; for example, the width of the dummy line DL (upper electrode layer 4Y) is designed to be narrower, in order to reduce the area between the upper electrode layer 4Y and the lower electrode layer 2S.

For example, the structures of the dummy line DL and the dummy transistor DT2 in FIG. 12 are manufactured as follows. In the process shown in FIG. 8, another opening OP is formed in order to form the conductive film 4D that becomes the dummy line. After the sidewall insulating film 41 is formed on the lateral surface of the lower electrodes 2S, a conductive film that will become a dummy line is formed on the inter-gate insulating film 3S and the sidewall insulating film 41 within the opening.

Further, a film thickness of the inter-gate insulating film 3S between the upper electrode layer 4S and the lower electrode layer 2S of the select transistor STD may be formed thinner than a film thickness of the inter-gate insulating film 3S between the upper electrode layer 4D and the lower electrode layer 2S of the dummy transistor DT2.

This can improve a coupling ratio between the upper electrode layer 4S and the lower electrode layer 2S of the select transistor STD. In this case, the film thickness of the inter-gate insulating film 3S between the upper electrode layer 4S and the lower electrode layer 2S of the select transistor STD is thinner than the film thickness of the inter-gate insulating film 3 between the control gate electrode 4 and the floating gate electrode 2 of the memory cell MC.

For example, just after the inter-gate insulating film is deposited, the inter-gate insulating film within the select transistor region is selectively formed thinner by etching.

FIG. 13 shows another variation example of the flash memory according to one of the embodiments.

As shown in FIG. 13, the lower electrode layer for a dummy transistor DT2Z and the lower electrode layer for the select transistor STD may be formed separately with respect to every unit of the dummy transistor DT2B and select transistor STD. The lower electrode layer 2D of the dummy transistor DT2B is electrically separated from the lower electrode layer 2S of the select transistor STD.

For example, the dummy transistor DT2B has, as the dummy line DL, the lower electrode layer 2D independent from the lower electrode 2S of the select transistor STD that is formed below the upper electrode layer 4D.

In this case, the threshold state of the dummy transistor DT2B can be set in the same state as an erasable state of the memory cell MC. Therefore, the potential control of the dummy line DL at the operation of the flash memory can be simplified.

Although in the variation examples the structures of the drain-side select transistors STD (bit line contact side), the dummy line DL, and the dummy transistor DT2 are shown, the above structures as having been described in FIGS. 12 and 13 may be applied to the structures of the source-side select transistors STS (source line contact side), the dummy line DL, and the dummy transistor DT2.

Similarly to the first, second, and third embodiments, the semiconductor memories shown in the variation examples can relieve the electric field between the bit line contact CB and the gate electrode 4S of the select transistor at the writing.

[Others]

Although the embodiments have been described using the NAND-type flash memory as a semiconductor memory, the embodiments may be used for a flash memory other than the NAND-type flash memory, such as NOR-type or AND-type flash memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
a bit line;
an active region formed in a semiconductor substrate;
a plug formed on the active region and connecting the bit line to the active region;
a memory cell which includes a first gate insulating film on the active region, a charge storage layer on the first gate insulating film, a first insulating film on the charge storage layer, and a control gate electrode on the first insulating film;
a select transistor formed between the plug and the memory cell on the active region and including a second gate insulating film on the active region, a first electrode layer on the second gate insulating film, a second insulating film on the first electrode layer, and a second electrode layer on the second insulating film; and
a wiring formed above the active region between the plug and the second electrode layer of the select transistor.

2. The semiconductor memory device according to claim 1, wherein
a voltage applied to the wiring is smaller than a voltage applied to the second electrode layer during a writing operation into the select transistor.

3. The semiconductor memory device according to claim 1, wherein
the first electrode layer is electrically isolated from the second electrode layer, and
the first electrode layer is in a floating state.

4. The semiconductor memory device according to claim 1, wherein
the size of the second electrode layer in a first direction along which the active region extends is larger than the size of the wiring in the first direction.

5. The semiconductor memory according to claim 4, wherein
the second electrode layer and the wiring are adjacent to each other in the first direction, and
the second electrode layer and the wiring extend in a second direction that crosses the first direction.

6. The semiconductor memory device according to claim 1, wherein
the wiring is formed on the second insulating film above the first electrode layer.

7. The semiconductor memory device according to claim 1, wherein
the wiring is formed on a third insulating film that is separate from the second insulating film and above a third electrode layer that is electrically isolated from the first electrode layer.

8. A semiconductor memory device comprising:
a source line;
an active region formed in a semiconductor substrate;
a plug formed on the active region and connecting the source line to the active region;
a memory cell which includes a first gate insulating film on the active region, a charge storage layer on the first gate insulating film, a first insulating film on the charge storage layer, and a control gate electrode on the first insulating film;
a select transistor formed between the plug and the memory cell on the active region and including a second gate insulating film on the active region, a first electrode layer on the second gate insulating film, a second insulating film on the first electrode layer, and a second electrode layer on the second insulating film; and
a wiring formed above the active region between the plug and the second electrode layer of the select transistor.

9. The semiconductor memory device according to claim 8, wherein
a voltage applied to the wiring is smaller than a voltage applied to the second electrode layer during a writing operation into the select transistor.

10. The semiconductor memory device according to claim 8, wherein
the first electrode layer is electrically isolated from the second electrode layer, and
the first electrode layer is in a floating state.

11. The semiconductor memory device according to claim 8, wherein
the size of the second electrode layer in a first direction along which the active region extends is larger than the size of the wiring in the first direction.

12. The semiconductor memory according to claim 11, wherein
the second electrode layer and the wiring are adjacent to each other in the first direction, and
the second electrode layer and the wiring extend in a second direction that crosses the first direction.

13. The semiconductor memory device according to claim 8, wherein
the wiring is formed on the second insulating film above the first electrode layer.

14. The semiconductor memory device according to claim 8, wherein
the wiring is formed on a third insulating film that is separate from the second insulating film and above a third electrode layer that is electrically isolated from the first electrode layer.

15. A semiconductor memory device comprising:
a bit line;
a source line;
an active region formed in a semiconductor substrate;
a first plug formed on the active region and connecting the bit line to the active region;
a second plug formed on the active region and connecting the source line to the active region;
a memory cell which includes a first gate insulating film on the active region, a charge storage layer on the first gate insulating film, a first insulating film on the charge storage layer, and a control gate electrode on the first insulating film;
a first select transistor formed between the first plug and the memory cell on the active region and including a second gate insulating film on the active region, a first electrode layer on the second gate insulating film, a second insulating film on the first electrode layer, and a second electrode layer on the second insulating film;
a first wiring formed above the active region between the first plug and the second electrode layer of the first select transistor;
a second select transistor formed between the second plug and the memory cell on the active region and including a third gate insulating film on the active region, a third electrode layer on the third gate insulating film, a third insulating film on the third electrode layer, and a fourth electrode layer on the third insulating film; and
a second wiring formed above the active region between the second plug and the fourth electrode layer of the second select transistor.

16. The semiconductor memory device according to claim 15, wherein
a voltage applied to the first wiring is smaller than a voltage applied to the second electrode layer during a writing operation into the first select transistor, and
a voltage applied to the second wiring is smaller than a voltage applied to the fourth electrode layer during a writing operation into the second select transistor.

17. The semiconductor memory device according to claim 15, wherein
the first electrode layer is electrically isolated from the second electrode layer and the third electrode layer is electrically isolated from the fourth electrode layer, and
the first and third electrode layers are in a floating state.

18. The semiconductor memory device according to claim 15, wherein
the size of the second electrode layer in a first direction along which the active region extends is larger than the size of the wiring in the first direction; and
the size of the fourth electrode layer in the first direction is larger than the size of the second wiring in the first direction.

19. The semiconductor memory device according to claim 15, wherein
the first wiring is formed on the second insulating film above the first electrode layer and the second wiring is formed on the third insulating film above the third electrode layer.

20. The semiconductor memory device according to claim 15, wherein
the second wiring is formed on a fifth insulating film that is separate from the third insulating film and above a fifth electrode layer that is electrically isolated from the third electrode layer.

* * * * *